(12) United States Patent
McCune et al.

(10) Patent No.: US 7,518,461 B1
(45) Date of Patent: Apr. 14, 2009

(54) METHOD OF CONFIGURING A POLAR-BASED MODULATOR USING A PARAMETER LOOK-UP TABLE

(75) Inventors: Earl W. McCune, Santa Clara, CA (US); Wayne S. Lee, San Mateo, CA (US)

(73) Assignee: Matsushita Electric Industrial Co., Ltd., Osaka (JP)

( * ) Notice: Subject to any disclaimer, the term of this patent is extended or adjusted under 35 U.S.C. 154(b) by 99 days.

(21) Appl. No.: 11/713,266

(22) Filed: Feb. 28, 2007

(51) Int. Cl.
*H03C 3/38* (2006.01)
(52) U.S. Cl. .................. 332/145; 332/144; 332/146; 332/150
(58) Field of Classification Search .......... 332/145–157
See application file for complete search history.

(56) References Cited

U.S. PATENT DOCUMENTS

| | | | |
|---|---|---|---|
| 6,366,177 B1 | 4/2002 | McCune et al. ............. 332/103 |
| 2001/0014593 A1 | 8/2001 | McCune ..................... 455/127 |
| 2002/0090920 A1 | 7/2002 | McCune ..................... 455/110 |
| 2002/0177420 A1 | 11/2002 | Sander et al. ............... 455/108 |
| 2005/0024147 A1 | 2/2005 | Meck ......................... 330/297 |
| 2005/0127992 A1 | 6/2005 | Schell et al. .................. 330/10 |
| 2005/0156662 A1* | 7/2005 | Raghupathy et al. .......... 330/10 |
| 2007/0037530 A1* | 2/2007 | Peckham et al. ............ 455/102 |

* cited by examiner

*Primary Examiner*—Anh Q Tran
(74) *Attorney, Agent, or Firm*—Haverstock & Owens LLP

(57) ABSTRACT

A polar-based modulator includes an amplitude signal generator operating at a set gain and a command module that selects an appropriate one parameter lookup table based on an identification of the current network communication system. The command module receives a digital representation of the desired amplitude and using the received digital amplitude and selected parameter lookup table determines control commands used by a scalar to appropriately modulate an amplitude modulated signal output from the amplitude signal generator. Use of the parameter lookup table and command module in the digital realm eliminates the complexities of comparable functionality in the analog realm. Further, operating the amplitude signal generator at a set gain and scaling the output eliminates the complexities associated with generating an appropriately amplified signal within the amplitude signal generator and improves the overall efficiency for generating such an amplitude modulated signal.

35 Claims, 3 Drawing Sheets

METHOD OF CONFIGURING A POLAR-BASED MODULATOR USING A PARAMETER LOOK-UP TABLE

FIELD

The present application relates to the field of polar based modulators. More particularly, the present application relates to the field of polar based modulators configured according to parameter look up tables.

BACKGROUND

Radio frequency (RF) power amplifiers are used extensively in the wireless communications industry. Using a typical RF power amplifier, an input baseband signal is modulated, amplified, and transmitted as an RF signal. To generate the RF signal, an analog input signal is first processed by a baseband processor to generate an in-phase (I) signal component and a quadrature (Q) signal component. The I and Q signal components are processed and mixed to form the RF signal.

An RF signal can also be generated using polar modulation, where the input baseband signal is converted to an amplitude modulation (AM) signal component and a phase modulation (PM) signal component. In a polar modulator, the AM signal and the PM signal are processed separately before being combined to create the desired signal.

Early power amplifiers processed input analog signals without any digital conversion. Appropriately processing and modulating analog signals is difficult to achieve. As digital processing has evolved, power amplifiers have included digital processing components along with traditional analog signal processing. However, absent a complete digital implementation, digital to analog conversions, such as those performed in an amplitude signal generator, introduce large discrepancies. In general, methods of improving the digital-to-analog and analog-to-digital conversion process are always needed. In particular, methods of improving the digital-to-analog and analog-to-digital conversion process within polar modulators are also needed.

SUMMARY

The present application is directed to a polar-based modulator that includes an amplitude signal generator operating at a set gain and a command module that selects an appropriate parameter lookup table based on an identification of the current network communication system. The command module receives a digital representation of the desired amplitude and using the received digital amplitude and selected parameter lookup table determines control commands used by a scalar to appropriately modulate an amplitude modulated signal output from the amplitude signal generator. Use of the parameter lookup table and command module in the digital realm eliminates the complexities of comparable functionality in the analog realm. Further, operating the amplitude signal generator at a set gain and scaling the output eliminates the complexities associated with generating an appropriately amplified signal within the amplitude signal generator and improves the overall efficiency for generating such an amplitude modulated signal.

In one aspect of the present application, a modulator outputs a modulated signal in response to an input analog signal. The modulator comprises a polar converter to output a digital phase signal with a phase characteristic and a digital amplitude signal with a first amplitude characteristic, wherein the digital phase signal and the digital amplitude signal correspond to the input analog signal, an amplitude signal generator to receive the digital amplitude signal from the polar converter, wherein the amplitude signal generator is configured to operate at a set gain and to output an first analog amplitude modulated signal with a second amplitude characteristic, a command module including a parameter lookup table is coupled to receive the digital amplitude signal and the first analog amplitude modulated signal, wherein the command module retrieves a first set of operation parameters from the parameter lookup table according to the digital amplitude signal, and determines a digital scaling factor according to the retrieved first set of operation parameters and the first analog amplitude modulated signal, a scalar to receive the digital scaling factor from the command module and to scale the first analog amplitude modulated signal according to the digital scaling factor, wherein the digitally driven scalar outputs a second analog amplitude modulated signal, and an amplifier coupled to receive the second analog amplitude modulated signal and an analog phase modulated signal as inputs and to output the modulated signal. The modulator can also include a phase modulator coupled to receive the digital phase signal and a carrier modulation as inputs and to output the analog phase modulated signal. The phase modulator can include a multi-segment voltage-controlled oscillator. The command module can also be coupled to receive the digital phase signal from the polar converter, and to determine a configuration of the multi-segment voltage controlled oscillator based on the operation parameters retrieved from the parameter lookup table. An output terminal of the amplifier can be coupled to an input terminal of the phase modulator such that the modulator is configured as a closed loop. Alternatively, the modulator can be configured as an open loop. The scalar can comprise a digitally driven scalar. The scalar can comprise either an analog scalar or a digital scalar. The amplitude signal generator can be configured to operate at full gain. The parameter lookup table can include a plurality of system-specific parameter lookup tables, each system-specific parameter lookup table includes associations between operation parameters for a specific type of network communication system. The command module can be configured to receive a control signal that identifies the specific type of network communication system, wherein the command module retrieves the first set of operation parameters from the system-specific parameter lookup table corresponding to the identified specific type of network communication system. The modulated signal can be an RF signal.

In another aspect of the present application, a modulator outputs a modulated signal in response to an input analog signal. The modulator comprises a polar converter to output a digital phase signal with a phase characteristic and a digital amplitude signal with a first amplitude characteristic, wherein the digital phase signal and the digital amplitude signal correspond to the input analog signal, an amplitude signal generator to receive the digital amplitude signal from the polar converter, wherein the amplitude signal generator is configured to operate at a set gain and to output an first analog amplitude modulated signal with a second amplitude characteristic, a memory including a plurality of system-specific parameter lookup tables, a command module coupled to receive the digital amplitude signal the first analog amplitude modulated signal, wherein the command module identifies a first system-specific parameter lookup table from the plurality of parameter lookup tables, retrieves a first set of operation parameters from the first system-specific parameter lookup table according to the digital amplitude signal, and determines a digital scaling factor according to the retrieved first set of operation parameters and the first analog amplitude modulated signal, a digitally driven scalar to receive the digital scaling factor from the command module and to scale the first analog amplitude modulated signal according to the digital scaling factor, wherein the digitally driven scalar outputs a second analog amplitude modulated signal, a phase modulator coupled to receive the digital phase signal and a carrier modulation as inputs and to output an analog phase modulated signal, and an amplifier coupled to receive the second analog amplitude modulated signal and the analog phase modulated signal as inputs and to output the modulated signal. An output terminal of the amplifier can be coupled to an input terminal of the phase modulator such that the modulator is configured as a closed loop. Alternatively, the modulator can be configured as an open loop. The scalar can comprise a digitally driven scalar. The scalar can comprise an analog scalar or a digital scalar. The amplitude signal generator can be configured to operate at full gain. Each system-specific parameter lookup table can include associations between operation parameters for a specific type of network communication system. The command module can be configured to receive a control signal that identifies the specific type of network communication system, thereby enabling the command module to identify the first system-specific parameter lookup table. The phase modulator can include a multi-segment voltage-controlled oscillator. The command module can be coupled to receive the digital phase signal from the polar converter, and to determine a configuration of the multi-segment voltage controlled oscillator based on the first set of operation parameters retrieved from the first system-specific parameter lookup table. The modulated signal can be an RF signal.

In yet another aspect of the present application, a modulator outputs a modulated signal in response to an input analog signal. The modulator comprises means for converting the input analog signal to a digital phase signal and a digital amplitude signal, means for generating a first analog amplitude modulated signal in response to the digital amplitude signal, wherein the means for generating includes means for amplifying the digital amplitude signal at a set gain, means for retrieving a first set of operation parameters from a parameter lookup table according to the digital amplitude signal, means for determining a digital scaling factor according to the first set of operation parameters and the first analog amplitude modulated signal, means for scaling the first analog amplitude modulated signal according to the digital scaling factor, thereby generating a second analog amplitude modulated signal, and means for modulating an analog phase modulated signal according to the second analog amplitude modulated signal, thereby generating the output modulated signal, wherein the phase modulated signal corresponds to the digital phase signal. The modulator can also include means for phase modulating the digital phase signal according to a carrier modulation, thereby generating the analog phase modulated signal. The output modulated signal can be an RF signal. The parameter lookup table can include a plurality of system-specific parameter lookup tables, each system-specific parameter lookup table includes associations between operation parameters for a specific type of network communication system. The means for amplifying the digital amplitude signal can be configured to operate at full gain.

BRIEF DESCRIPTION OF THE SEVERAL VIEWS OF THE DRAWINGS

The present application is described relative to the several views of the drawings. Where appropriate and only where identical elements are disclosed and shown in more than one drawing, the same reference numeral will be used to represent such identical elements.

DETAILED DESCRIPTION

Figure 1:
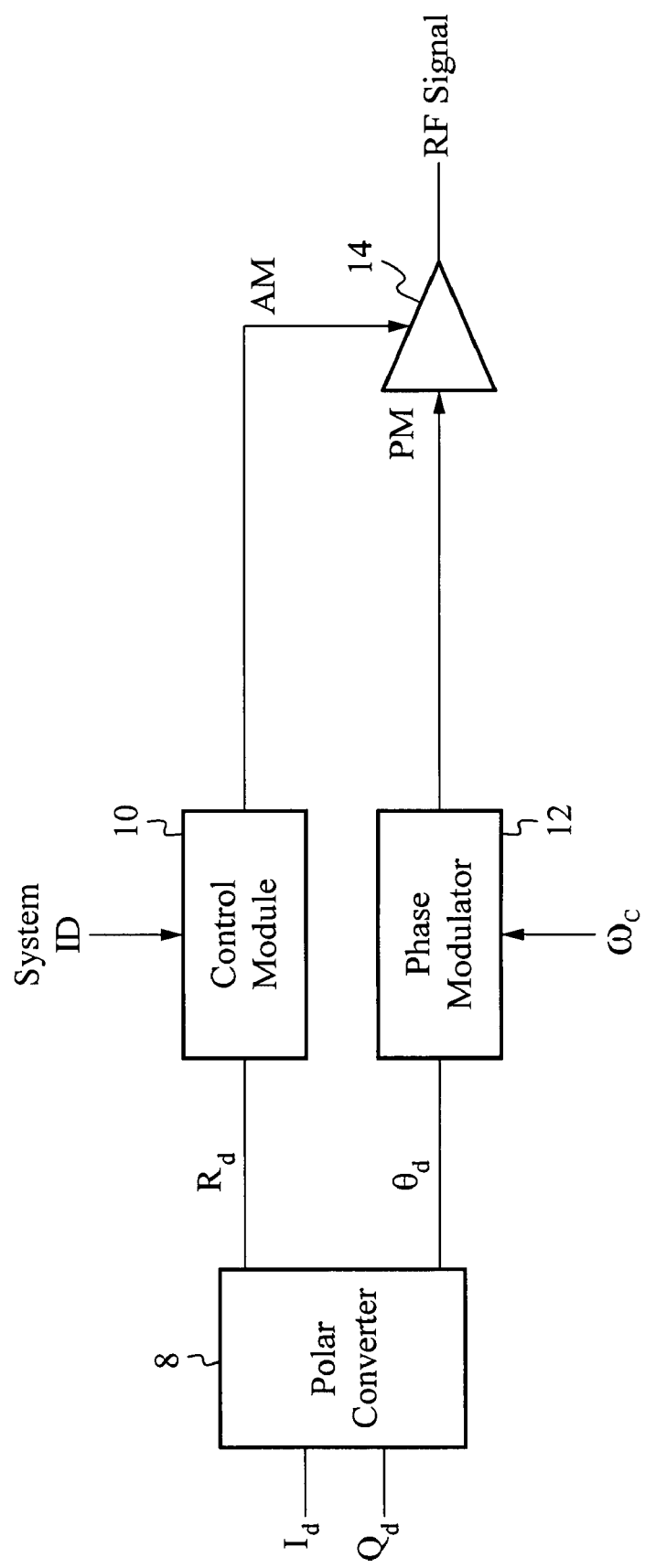
FIG. 1 illustrates a conceptual block diagram of a polar based modulator.

Embodiments of the present application are described herein in the context of an apparatus and method for configuring a polar based modulator using a parameter lookup table. Those of ordinary skill in the art will realize that the following detailed description of the present application is illustrative only and is not intended to be in any way limiting. Other embodiments of the present application will readily suggest themselves to such skilled persons having the benefit of this disclosure.

Reference will now be made in detail to implementations of the present application as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with the present application, some of the components, process steps, and/or data structures may be implemented using various types of digital systems, including hardware, software, or any combination thereof. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein.

The polar based modulator of the present application includes the command module with access to the plurality of parameter lookup tables. The plurality of parameter lookup tables are stored in memory. The memory can be included within the command module, separate from the command module yet within the polar modulator, or external to the polar modulator. Each parameter lookup table corresponds to a specific type of network communication system. Each parameter lookup table includes operation parameters and program instructions specific to the network communication system type, with the purpose of configuring the polar-based modulator. The polar modulator architecture lends itself to the generation of GMSK/EDGE/AMPS and IS-136 compatible modulated RF signals. Alternatively, any other conventional type of modulated signal, such as WCDMA and WLAN, can be generated by the polar modulator. The capability covers not only one transmit band, but every band specified within any of the standards.

The parameter lookup table and the command module are closely intertwined. The command module can be viewed as the interface barrier between the polar modulator and the outside world, the vehicle in which an external apparatus, for example a baseband processor, drives the polar modulator by sending high-level commands. The parameter lookup table can be viewed as an interpreter. High-level commands are matched against the parameter lookup table, where detailed instructions are found and executed by the command module.

The parameter lookup table includes, but is not limited to, parameters for frequency tuning, power level settings, power amplifier calibration, loop bandwidth settings, and a sequence of instruction op-codes for each band, such as PCS, DCS, and 800/900 MHz. For example, in Europe the 800/900 MHz "low" band, along with the DCS band 1800 MHz are stored as one parameter lookup table. In the U.S., the PCS band and the U.S. low-band are stored in another parameter lookup table. One unique parameter lookup table exists for each region. Additionally, other static parameters, such as constants, that are also needed in the normal operation of the polar modulator can be included within the parameter lookup table.

The sequence of operation codes that forms the program code for the command module enables the polar modulator to wake-up the necessary preparation components for modulation, then wait for a timing signal from the baseband processor. Upon reception of such a timing signal, the polar modulator executes an RF ramp up to the desired power level while modulating signals provided by the baseband processor. The polar modulator then ramps down and enters a sleep mode, if necessary.

The parameter lookup table includes a direct computing algorithm that is usually digitally implemented by decompressing a frequency index into a set of values that are written into frequency tuned registers. The parameter lookup table for each region is compiled, then linked into a baseband processor executable code forming a binary image file that is suitable for storage in a flash memory. Parameters for several regions can be included in flash memory, depending on operating requirements. The baseband processor then transfers the section of the parameter lookup table corresponding to the operating memory region from non-volatile memory.

Associated with each power level are several words whose values describe the settings for the amplitude digital-to-analog conversion (DAC) values. Power amplification correction values, compensating for AM-AM and AM-PM non-linearity, along with several miscellaneous flags used by a clip-detection and power back-off algorithm, exist at each power level. Power level settings and associated parameters are usually stored as a subset of N frequencies, for example at the three frequencies, low, medium, and high. For frequencies other than the stored subset, algorithms are used to calculate the resulting parameters based on a linear interpolation between the closest two end points (e.g., low-mid or mid-high). Power amplification correction values and final stage drain DAC values are interpolated across frequencies. Alternatively, power level settings and associated parameters are stored at more, or less, than three frequencies. Another set of parameters that are associated with each power level, but are not interpolated across frequencies, are timing alignment or delay adjustment between the amplitude-path and the phase-path.

FIG. 1 illustrates a conceptual block diagram of a polar based modulator. The polar based modulator includes a polar converter 8, a control module 10, a phase modulator 12 and an amplifier 14. The polar converter 8 receives as input, digital representations of the real and imaginary signal components of an input signal and outputs digital representations of the corresponding digital phase and digital amplitude signal components, θd and Rd, respectively. The digital amplitude component Rd is input to the control module 10 and the digital phase signal θd is input to the phase modulator 12. The control module 10 also receives a system ID from which one of a plurality of available parameter lookup tables is selected. In one embodiment, the control module 10 stores the plurality of parameter lookup tables. Alternatively, the plurality of parameter lookup tables are stored externally and the control module 10 either downloads the select one parameter lookup table or sends requests to the external source to provide portions of the select one parameter lookup table as needed.

Each parameter lookup table includes operation parameters used by the polar based modulator to properly output a modulated RF signal. The control module 10 modulates the digital magnitude signal Rd according to the operation parameters specified in the selected parameter lookup table and outputs an analog amplitude modulated (AM) signal.

The phase modulator 12 modulates the carrier signal ωc according to a desired digital phase signal θd and outputs an analog phase modulated (PM) signal. The analog PM signal and the analog AM signal are input to the amplifier 14, which outputs the desired RF signal.

Figure 2:
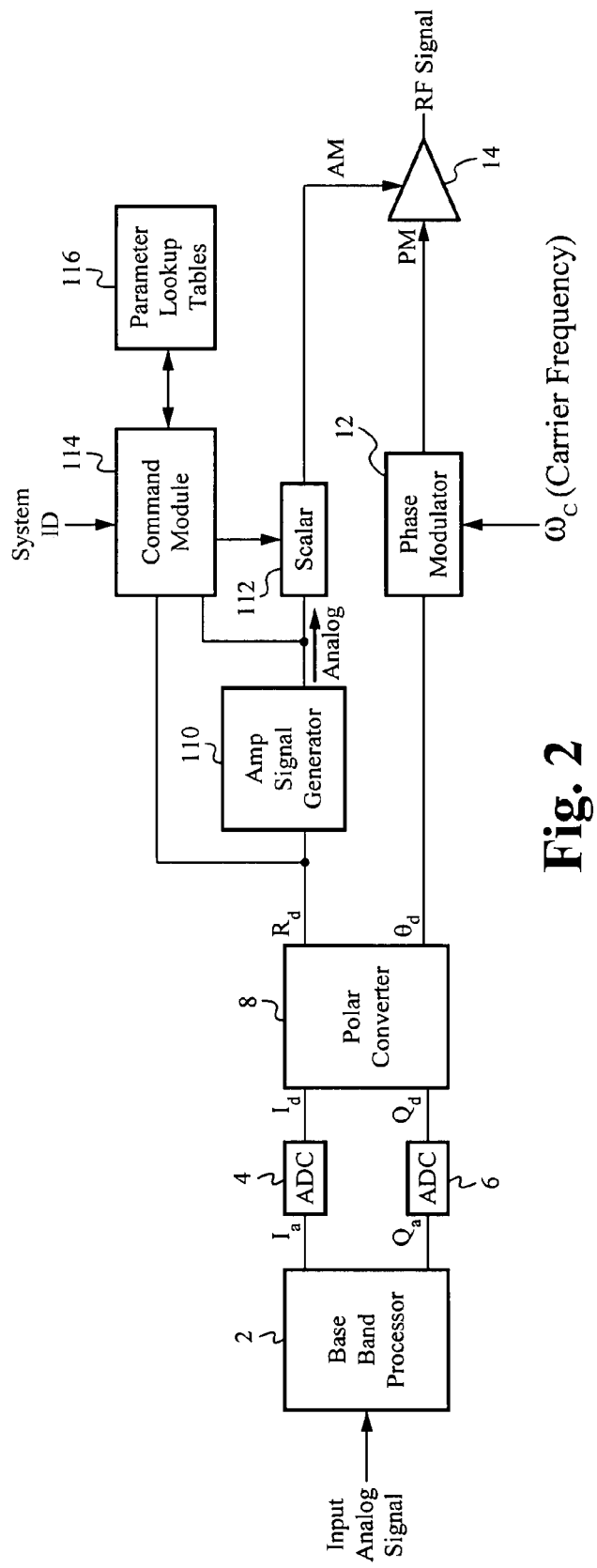
FIG. 2 illustrates a functional block diagram of a first embodiment of the polar modulator.

FIG. 2 illustrates a functional block diagram of a first embodiment of the polar modulator. A baseband processor 2 receives as input information to be transmitted, such as a person's speech, and outputs corresponding real and imaginary signal components, an analog in-phase signal Ia and an analog quadrature signal Qa, respectively. An analog-to-digital (ADC) converter 4 converts the analog in-phase signal Ia to the digital in-phase signal Id. An ADC converter 6 converts the analog quadrature signal Qa to the digital quadrature signal Qd. Alternatively, the baseband processor 2 may directly calculate digital values Id and Qd. These values may be directly output to the polar modulator. The polar converter 8 receives the digital in-phase signal Id and the digital quadrature signal Qd, and outputs the digital amplitude signal Rd and the digital phase signal θd.

As shown in FIG. 2, the control module 10 from FIG. 1 includes an amplitude signal generator 110, a scalar 112, a command module 114, and a memory 116. The command module 114 receives the system ID and retrieves the appropriate parameter lookup table from the plurality of parameter lookup tables stored in the memory 116. Each parameter lookup table stored in the memory 116 includes operational parameters associated with a specific type of network communication system. The command module 114 is coupled to receive the digital amplitude signal Rd.

The amplitude signal generator 110 is also coupled to receive the digital amplitude signal Rd. The amplitude signal generator 110 is usually configured to operate at a set gain and to output a first analog amplitude modulated (AM) signal in response to the input digital amplitude signal Rd. In one embodiment, the amplitude signal generator 110 is set to operate at full gain. Alternatively, the amplitude signal generator 110 is set to operate at a set gain less than the full gain. The command module 114 and the scalar 112 are each coupled to the amplitude signal generator 110 to receive the first analog AM signal. The scalar 112 outputs a second analog AM signal in response to a scaling factor provided by the command module 114. The scaling factor is determined by the command module 114 according to the digital amplitude signal Rd, the first analog AM signal, and the selected parameter lookup table. The command module 114 uses the selected parameter lookup table to determine a phase value that corresponds to the received digital amplitude signal Rd, so as to match the analog PM signal generated by the phase modulator 12. The appropriate scaling factor results in the second analog AM signal including the desired amplitude characteristics corresponding to the digital amplitude signal Rd and the phase necessary to match the analog PM signal.

The second analog AM signal that is input to the amplifier 14 modulates the analog PM signal, thereby resulting in an RF signal with interior frequency characteristics corresponding to the analog PM signal and bound by an envelope with amplitude characteristics corresponding to the second analog AM signal. The RF signal is generated by properly matching the second analog AM signal to the analog PM signal as input to the amplifier 14.

Figure 3:
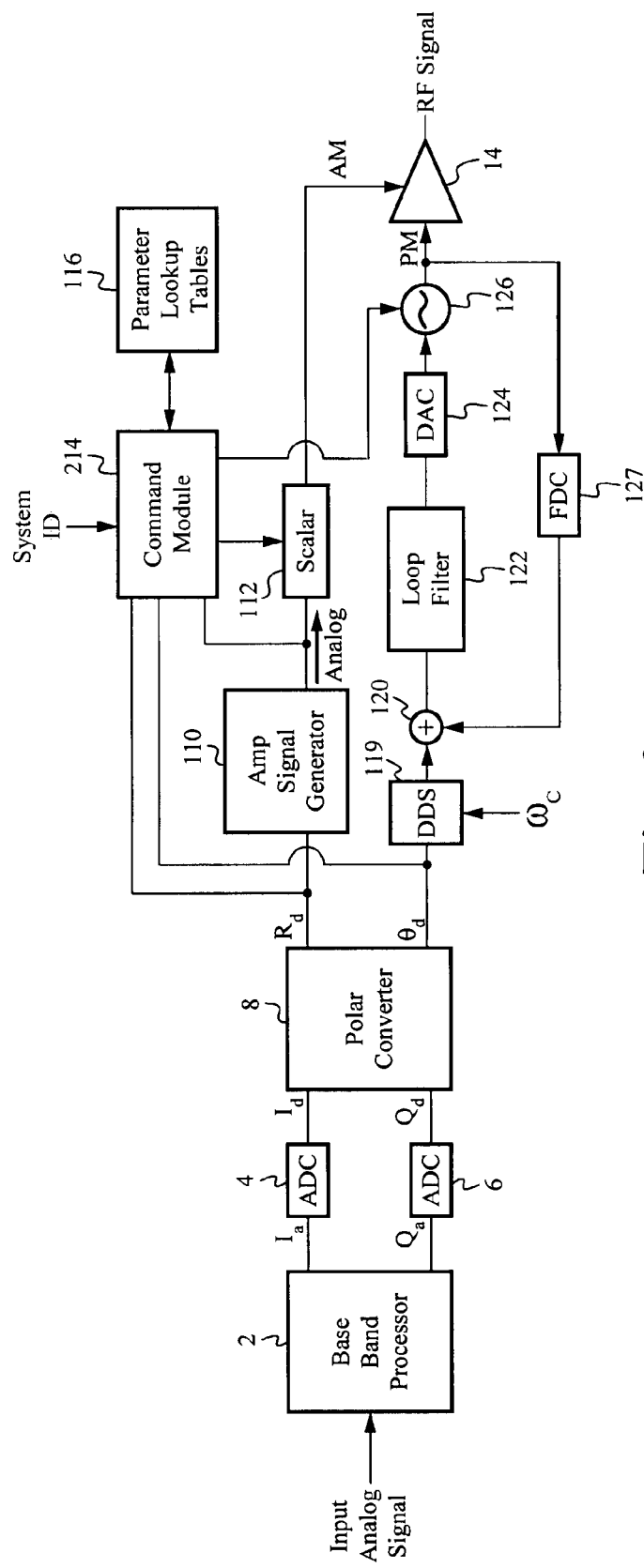
FIG. 3 illustrates a functional block diagram of a second embodiment of the polar modulator.

FIG. 3 illustrates a functional block diagram of a second embodiment of the polar modulator. In addition to the functionality described above in relation to the first embodiment of the polar modulator of FIG. 2, the second embodiment of the polar modulator shown in FIG. 3 includes control of a multi-segment voltage controlled oscillator (VCO) 126 to dynamically configure the inductance of the VCO 126 to optimize the analog PM signal. A command module 214 receives as input the digital phase signal θd, the digital amplitude signal Rd, and the first analog AM signal output from the amplitude signal generator 110. The command module 214 determines an optimal setting for the VCO 126 based on the digital phase signal θd and by the operation parameters retrieved from the selected parameter lookup table. The frequency and voltage characteristics of the multi-segment VCO 126 are included in the selected parameter lookup table. By initializing the VCO 126 with the segment selection that best matches the digital phase signal θd, proper tuning of the analog PM signal is more quickly achieved. This procedure can also be done on the fly, where the command module 214 matches the known digital phase to the frequency-voltage characteristics of the multi-segment VCO 126 stored in the parameter lookup table to determine an optimal configuration of the VCO 126. A control command is then sent to the VCO 126 to update its configuration, and operation, accordingly.

The phase path includes a digital synthesizer 119, a digital comparator 120, a digital loop filter 122, a digital-to-analog converter 124 and the multi-segment VCO 126. The phase path shown in FIG. 3 is a closed loop, where the feedback loop includes a frequency-to-digital converter 127. Carrier frequency selection is input to the digital synthesizer 119.

The command module 214 also includes the functionality of the command module 114 (FIG. 2) to properly modulate the second analog AM signal provided to the amplifier 14.

The polar modulators described above are described as open loop configurations. It is understood that the polar modulators of the present application can also be configured as closed loops. It is also understood that although the polar modulators are described in relation to a baseband processor, the polar modulators are not limited to input from baseband signals and can be used to generate a modulated output in response to a received signal within any other frequency domain. The polar modulators are also described as outputting modulated RF signals, however it is understood that the polar modulators of the present application can generate modulated signals for transmission in any transmit band specified by the standards.

The present application has been described in terms of specific embodiments incorporating details to facilitate the understanding of the principles of construction and operation of the polar based modulator. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. A machine comprising:
   a polar converter to output a digital amplitude signal and a digital phase signal;
   a control module to input the digital amplitude signal and output an analog amplitude modulated signal according to one or more parameters based on information of a current network communication system, wherein the current network communication system is identified based on a received system identification; and
   an amplifier coupled to receive the analog amplitude modulated signal and an analog phase modulated signal based on the digital phase signal as inputs and to output a modulated signal.

2. The machine of claim 1 wherein the control module comprises:
   a memory including a plurality of parameter lookup tables; and
   a selector selecting at least one of the plurality of parameter lookup tables based on the information of the network communication system.

3. The machine of claim 1 wherein the control module comprises a receiver receiving the one or more parameters stored externally.

4. The machine of claim 2 wherein the control module further comprises a programmable sequencer to control machine functions independent of external commands.

5. The machine of claim 4, wherein programming instructions for the programmable sequencer are stored within the memory.

6. A modulator to output a modulated signal in response to an input analog signal, the modulator comprising:
   a. a polar converter to output a digital phase signal with a phase characteristic and a digital amplitude signal with a first amplitude characteristic, wherein the digital phase signal and the digital amplitude signal correspond to the input analog signal;
   b. an amplitude signal generator to receive the digital amplitude signal from the polar converter, wherein the amplitude signal generator is configured to operate at a set gain and to output a first analog amplitude modulated signal with a second amplitude characteristic;
   c. a command module including a parameter lookup table is coupled to receive the digital amplitude signal and the first analog amplitude modulated signal, wherein the command module retrieves a first set of operation parameters from the parameter lookup table according to the digital amplitude signal, and determines a digital scaling factor according to the retrieved first set of operation parameters and the first analog amplitude modulated signal;
   d. a scalar to receive the digital scaling factor from the command module and to scale the first analog amplitude modulated signal according to the digital scaling factor, wherein the digitally driven scalar outputs a second analog amplitude modulated signal; and
   e. an amplifier coupled to receive the second analog amplitude modulated signal and an analog phase modulated signal as inputs and to output the modulated signal.

7. The modulator of claim 6 further comprising a phase modulator coupled to receive the digital phase signal and a carrier modulation as inputs and to output the analog phase modulated signal.

8. The modulator of claim 7 wherein the phase modulator includes a multi-segment voltage-controlled oscillator.

9. The modulator of claim 8 wherein the command module is coupled to receive the digital phase signal from the polar converter, and to determine a configuration of the multi-segment voltage controlled oscillator based on the operation parameters retrieved from the parameter lookup table.

10. The modulator of claim 7 wherein an output terminal of the amplifier is coupled to an input terminal of the phase modulator such that the modulator is configured as a closed loop.

11. The modulator of claim 6 wherein the modulator is configured as an open loop.

12. The modulator of claim 6 wherein the scalar comprises a digitally driven scalar.

13. The modulator of claim 12 wherein the scalar comprises an analog scalar.

14. The modulator of claim 12 wherein the scalar comprises a digital scalar.

15. The modulator of claim 6 wherein the amplitude signal generator is configured to operate at full gain.

16. The modulator of claim 6 wherein the parameter lookup table includes a plurality of system-specific parameter lookup tables, each system-specific parameter lookup table includes associations between operation parameters for a specific type of network communication system.

17. The modulator of claim 16 wherein the command module is configured to receive a control signal that identifies the specific type of network communication system, wherein the command module retrieves the first set of operation parameters from the system-specific parameter lookup table corresponding to the identified specific type of network communication system.

18. The modulator of claim 6 wherein the modulated signal is an RF signal.

19. A modulator to output a modulated signal in response to an input analog signal, the modulator comprising:
 a. a polar converter to output a digital phase signal with a phase characteristic and a digital amplitude signal with a first amplitude characteristic, wherein the digital phase signal and the digital amplitude signal correspond to the input analog signal;
 b. an amplitude signal generator to receive the digital amplitude signal from the polar converter, wherein the amplitude signal generator is configured to operate at a set gain and to output an first analog amplitude modulated signal with a second amplitude characteristic;
 c. a memory including a plurality of system-specific parameter lookup tables;
 d. a command module coupled to receive the digital amplitude signal the first analog amplitude modulated signal, wherein the command module identifies a first system-specific parameter lookup table from the plurality of parameter lookup tables, retrieves a first set of operation parameters from the first system-specific parameter lookup table according to the digital amplitude signal, and determines a digital scaling factor according to the retrieved first set of operation parameters and the first analog amplitude modulated signal;
 e. a digitally driven scalar to receive the digital scaling factor from the command module and to scale the first analog amplitude modulated signal according to the digital scaling factor, wherein the digitally driven scalar outputs a second analog amplitude modulated signal;
 f. a phase modulator coupled to receive the digital phase signal and a carrier modulation as inputs and to output an analog phase modulated signal; and
 g. an amplifier coupled to receive the second analog amplitude modulated signal and the analog phase modulated signal as inputs and to output the modulated signal.

20. The modulator of claim 19 wherein an output terminal of the amplifier is coupled to an input terminal of the phase modulator such that the modulator is configured as a closed loop.

21. The modulator of claim 19 wherein the modulator is configured as an open loop.

22. The modulator of claim 19 wherein the scalar comprises a digitally driven scalar.

23. The modulator of claim 22 wherein the scalar comprises an analog scalar.

24. The modulator of claim 22 wherein the scalar comprises a digital scalar.

25. The modulator of claim 19 wherein the amplitude signal generator is configured to operate at full gain.

26. The modulator of claim 19 wherein each system-specific parameter lookup table includes associations between operation parameters for a specific type of network communication system.

27. The modulator of claim 26 wherein the command module is configured to receive a control signal that identifies the specific type of network communication system, thereby enabling the command module to identify the first system-specific parameter lookup table.

28. The modulator of claim 19 wherein the phase modulator includes a multi-segment voltage-controlled oscillator.

29. The modulator of claim 28 wherein the command module is coupled to receive the digital phase signal from the polar converter, and to determine a configuration of the multi-segment voltage controlled oscillator based on the first set of operation parameters retrieved from the first system-specific parameter lookup table.

30. The modulator of claim 19 wherein the modulated signal is an RF signal.

31. A modulator to output a modulated signal in response to an input analog signal, the modulator comprising:
 a. means for converting the input analog signal to a digital phase signal and a digital amplitude signal;
 b. means for generating a first analog amplitude modulated signal in response to the digital amplitude signal, wherein the means for generating includes means for amplifying the digital amplitude signal at a set gain;
 c. means for retrieving a first set of operation parameters from a parameter lookup table according to the digital amplitude signal;
 d. means for determining a digital scaling factor according to the first set of operation parameters and the first analog amplitude modulated signal;
 e. means for scaling the first analog amplitude modulated signal according to the digital scaling factor, thereby generating a second analog amplitude modulated signal; and
 f. means for modulating an analog phase modulated signal according to the second analog amplitude modulated signal, thereby generating the output modulated signal, wherein the phase modulated signal corresponds to the digital phase signal.

32. The modulator of claim 31 further comprising means for phase modulating the digital phase signal according to a carrier modulation, thereby generating the analog phase modulated signal.

33. The modulator of claim 31 wherein the output modulated signal is an RF signal.

34. The modulator of claim 31 wherein the parameter lookup table includes a plurality of system-specific parameter lookup tables, each system-specific parameter lookup table includes associations between operation parameters for a specific type of network communication system.

35. The modulator of claim 31 wherein the means for amplifying the digital amplitude signal is configured to operate at full gain.

* * * * *